United States Patent
Suh et al.

(10) Patent No.: US 11,823,762 B2
(45) Date of Patent: *Nov. 21, 2023

(54) LOW POWER MEMORY SYSTEM USING DUAL INPUT-OUTPUT VOLTAGE SUPPLIES

(71) Applicant: QUALCOMM Incorporated, San Diego, CA (US)

(72) Inventors: Jungwon Suh, San Diego, CA (US); Joon Young Park, San Diego, CA (US); Mahalingam Nagarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/150,155

(22) Filed: Jan. 4, 2023

(65) Prior Publication Data

US 2023/0154502 A1    May 18, 2023

Related U.S. Application Data

(63) Continuation of application No. 17/158,485, filed on Jan. 26, 2021, now Pat. No. 11,551,730.

(51) Int. Cl.
*G11C 5/02* (2006.01)
*G11C 5/14* (2006.01)
*H03K 7/02* (2006.01)

(52) U.S. Cl.
CPC ............ *G11C 5/147* (2013.01); *H03K 7/02* (2013.01)

(58) Field of Classification Search
CPC ................................ G11C 5/147; H03K 7/02
USPC .......................................................... 365/226
See application file for complete search history.

(56) References Cited

U.S. PATENT DOCUMENTS

| | | |
|---|---|---|
| 9,911,469 B1 | 3/2018 | Hollis et al. |
| 10,740,264 B1 | 8/2020 | Benedict et al. |
| 10,998,035 B1 | 5/2021 | Lovett |
| 11,551,730 B2 * | 1/2023 | Suh .................. G11C 5/147 |
| 2019/0044764 A1 | 2/2019 | Hollis et al. |
| 2019/0103143 A1 | 4/2019 | Hasbun et al. |
| 2019/0179769 A1 | 6/2019 | Keeth et al. |
| 2019/0317587 A1 | 10/2019 | Hsu |
| 2020/0007362 A1 | 1/2020 | Kim et al. |
| 2020/0125505 A1 | 4/2020 | Brox et al. |
| 2022/0238142 A1 | 7/2022 | Suh et al. |

OTHER PUBLICATIONS

International Search Report and Written Opinion—PCT/US2021/061941—ISA/EPO—dated Mar. 29, 2022.

* cited by examiner

*Primary Examiner* — Huan Hoang
(74) *Attorney, Agent, or Firm* — The Marbury Law Group/Qualcomm

(57) ABSTRACT

Various embodiments include a computing device memory system having a memory device, a memory physical layer communicatively connected to the memory device, a first input/output (IO) voltage supply electrically connected to the memory device and to the memory physical layer, and a second TO voltage supply electrically connected to the memory device and to the memory physical layer, in which the memory device and the physical layer are configured to communicate data of a memory transaction using a 3 level pulse amplitude modulation (PAM) IO scheme.

30 Claims, 13 Drawing Sheets

500

| 3 Wires Binary Signals | | | 2 Wires PAM-3 Signals | |
|---|---|---|---|---|
| DQ0 | DQ1 | DQ2 | IO-x | IO-y |
| L | L | L | L | L |
| H | L | L | M | L |
| L | H | L | L | M |
| H | H | L | M | M |
| L | L | H | H | L |
| H | L | H | L | H |
| L | H | H | H | M |
| H | H | H | M | H |

FIG. 5

LOW POWER MEMORY SYSTEM USING DUAL INPUT-OUTPUT VOLTAGE SUPPLIES

RELATED APPLICATIONS

This application is a continuation application of U.S. patent application Ser. No. 17/158,485 filed on Jan. 26, 2021, entitled "Low Power Memory System Using Dual Input-Output Voltage Supplies," the entire contents of which is incorporated herein by reference.

BACKGROUND

Next generation low-power double data rate (LPDDR) memory (e.g., LPDDR6) can offer a balance of high performance, low power, competitive memory cost, various package types, and multi-sourcing availability that are attractive for mobile and non-mobile applications.

SUMMARY

Various disclosed aspects may include apparatuses and methods for memory system using dual input/output (IO) voltage supplies. Various aspects may include a computing device memory system having a memory device, a memory physical layer communicatively connected to the memory device, a first input/output (IO) voltage supply electrically connected to the memory device and to the memory physical layer, and a second IO voltage supply electrically connected to the memory device and to the memory physical layer, in which the memory device and the physical layer may communicate data of a memory transaction using a 3 level pulse amplitude modulation (PAM) IO scheme.

In some aspects, the first IO voltage supply is a first dedicated IO voltage supply, and the second IO voltage supply is a second dedicated IO voltage supply.

In some aspects, the first IO voltage supply is a dedicated IO voltage supply, and the second IO voltage supply is a shared IO voltage supply.

Some aspects may further include a first core voltage supply and a second core voltage supply, in which each of the first core voltage supply and the second core voltage supply are electrically connected to the memory device, and in which the shared IO voltage supply is electrically connected to the second core voltage supply.

Some aspects may further include a third core voltage supply, in which the third core voltage supply is electrically connected to the memory device, and in which a voltage of the second core voltage supply is greater than a voltage of the third core voltage supply.

Some aspects may further include a first core voltage supply, a second core voltage supply, and a third core voltage supply, in which each of the first core voltage supply, the second core voltage supply, and the third core voltage supply are electrically connected to the memory device, in which the shared IO voltage supply is electrically connected to the third core voltage supply, and in which a voltage of the second core voltage supply is greater than a voltage of the third core voltage supply.

In some aspects, a voltage of the second IO voltage supply is greater than a voltage of the first IO voltage supply.

In some aspects, the data of the memory transaction is binary data, and the memory device and the memory physical layer may further convert between the binary data and 3 level PAM IO scheme signals using the first IO voltage supply and the second IO voltage supply.

In some aspects, the memory device may encode the data of the memory transaction for generating a 3 level PAM signal, and generate the 3 level PAM signal by controlling selective electrical connection of the first IO voltage supply, the second IO voltage supply, or a ground to a component of the memory device according to the encoded data.

In some aspects, the memory physical layer may encode the data of the memory transaction for generating a 3 level PAM signal, and generate the 3 level PAM signal by controlling a selective electrical connection of the first IO voltage supply, the second IO voltage supply, or a ground to a component of the memory physical layer according to the encoded data.

Various aspects include computing devices having means for performing any of the functions of the computing device summarized above. Various aspects include methods to perform any of the functions of the computing device summarized above.

BRIEF DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIG. 5 is a table illustrating an example of 3 level PAM coding for implementing various embodiments.

DETAILED DESCRIPTION

Figure 1:
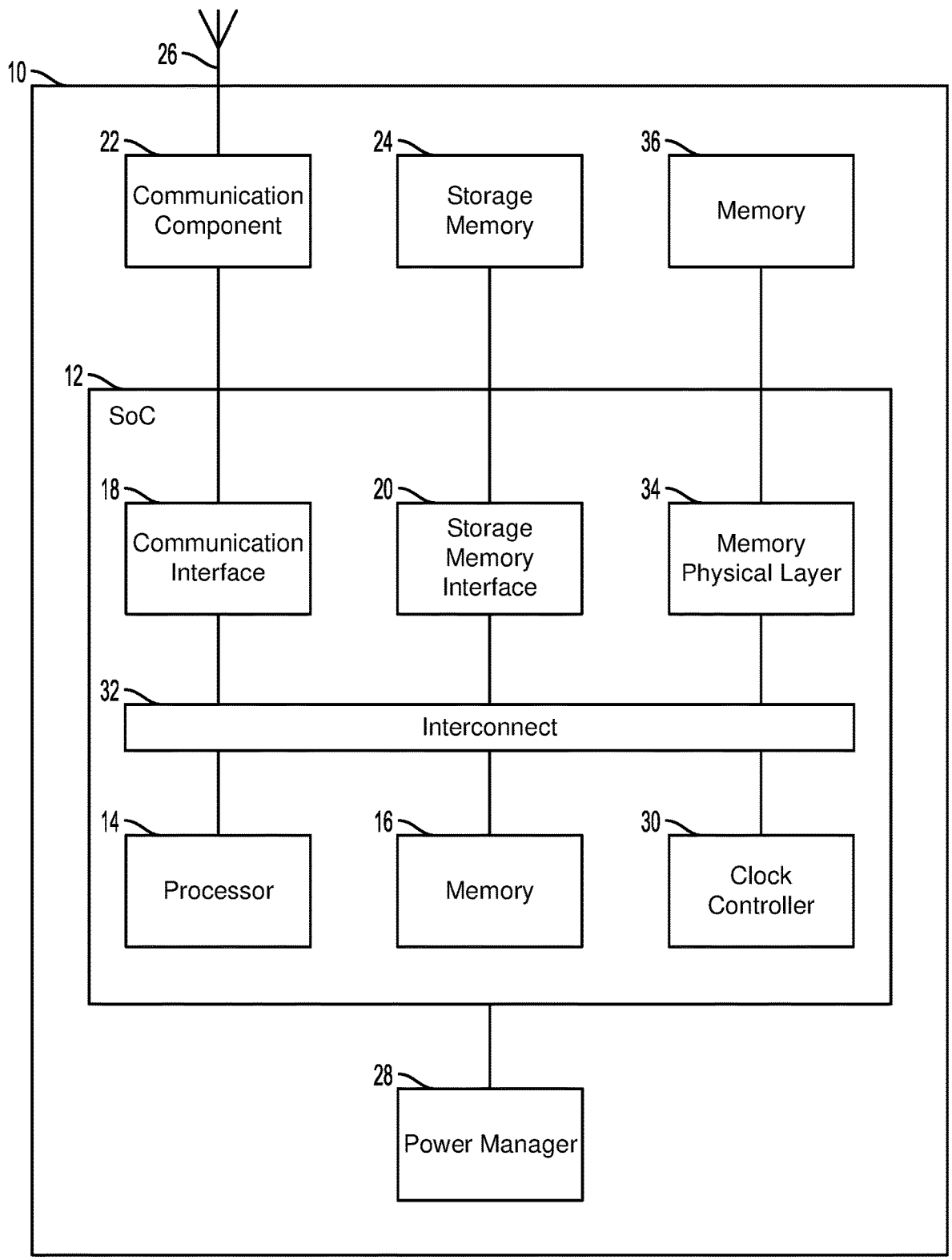
FIG. 1 is a component block diagram illustrating an example computing device suitable for implementing various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include circuitry, methods, and computing devices implementing such methods for memory systems using dual input/output (IO) voltage supplies. Some embodiments may include memory systems having dual input/output (IO) voltage supplies in which a memory interface of a system on chip (SoC) and an IO block of a memory device are connected to and receive voltage from dual IO voltage supplies. Some embodiments may include IO structures configured to implement 3 level pulse amplitude modulation (PAM or PAM-3) using dual IO voltages.

The terms "computing device" and "mobile device" are used interchangeably herein to refer to any one or all of cellular telephones, smartphones, personal or mobile multimedia players, personal data assistants (PDA's), laptop computers, tablet computers, convertible laptops/tablets (2-in-1 computers), smartbooks, ultrabooks, netbooks, palm-top computers, wireless electronic mail receivers, multimedia Internet enabled cellular telephones, mobile gaming consoles, wireless gaming controllers, and similar personal electronic devices that include a memory, and a programmable processor. The term "computing device" may further refer to stationary computing devices including personal computers, desktop computers, all-in-one computers, workstations, super computers, mainframe computers, embedded computers, servers, home theater computers, and game consoles.

The adjectives "high," "higher," "low" and "lower" are used herein as relative terms to distinguish different levels of voltage or power demand characterizing various aspects, such as voltage supplies, IO schemes, memory systems, etc. For example, two voltage supplies included in a memory system that differ in terms of their voltage levels may be distinguished in the following descriptions of various embodiments as a "high voltage supply" and a "low voltage supply." The terms "high," "higher," "low" and "lower" are not intended to indicate or suggest a particular value of level of the characterized aspect. For example, the voltage of a "high voltage supply" may differ from the voltage of a "low voltage supply" by one, two or a few volts.

Embodiments described herein include memory systems using dual IO voltage supplies for implementing a 3 level PAM IO scheme, that enable improved performance and reduced power demand compared to conventional memory systems. The memory systems may include a memory interface of an SoC and an IO block of a memory device connected to and configured to receive voltage from dual IO voltage supplies. In some embodiments, the dual IO voltage supplies may include two dedicated TO voltage supplies. In some embodiments, the dual TO voltage supplies may include a dedicated TO voltage supply and a shared TO voltage supply. The shared TO voltage supply may include a core voltage supply of the memory device. In some embodiments, shared TO voltage supply may include a core high voltage supply of the memory device. In some embodiments, the shared TO voltage supply may include a core low voltage supply of the memory device. As used herein, the term "TO voltage supply" refers to a voltage supply connected to the TO block of the memory device. As used herein, the term "core voltage supply" refers to a voltage supply connected to the internal circuitry of the memory device, which may include, for example, a memory bitcell array. As used herein, the term "shared TO voltage supply" refers to a voltage supply connected to the TO block and to a core voltage supply.

In some embodiments, an TO block of the memory device may include structures configured to control an output of signals for implementing the 3 level PAM IO scheme. The TO block may be, for example, a 3 level pulse amplitude modulator. The TO block may receive a data signal and encode the data signal to transmitter input signals. The TO block may interpret the transmitter input signals and control selection and output of the voltage supplied to the TO block from the dual TO voltage supplies configured to represent the signal states of the 3 level PAM IO scheme. In some embodiments, the TO block may also receive 3 level PAM signals, and include structures configured to convert the 3 level PAM signals to data signals and output the data signals. In some embodiments, the TO block may compare the 3 level PAM signals to voltage reference signals, which may generate and output receiver output signals. The TO block may decode the receiver output signals and generate and output the data signals.

In some embodiments, system error correction code (ECC), link ECC, or other system functions may be supported to enhance memory system reliability and stability. The ECC or other system function values may be encoded and decoded along with the data signals as part of the 3 level PAM IO scheme.

Using the dual IO voltage supplies to implement the 3 level PAM IO scheme allows for increased bandwidth for communication with the memory device by increasing the number of IO signaling levels used in such communication as compared to two IO signaling level (e.g., high and low) schemes. While providing higher memory system bandwidth than existing low-power double data rate memory (LPDDR) specifications (e.g., LPDDR5), the IO signaling levels increase and dual rank support allow for flexible memory package options and configurations that many systems require without significant cost overhead.

Further, embodiments described herein provide memory systems using an IO scheme that draws less power than conventional single IO voltage 3 level PAM scheme memory systems. By using a lower voltage IO voltage supply in addition to an existing higher IO voltage supply, overall memory system power consumption may be reduced as the higher IO voltage supply may be used less often, such as when the lower voltage IO voltage supply is used. Additionally, in some embodiments, by sharing a memory core voltage supply with one of the dual IO voltage supplies, there may be no further system cost overhead to support the additional IO voltage supply in the memory system.

Some of the embodiments described herein may be particularly well suited for memory sub-systems and memory devices for user equipment, mobile computing, automotive, and artificial intelligence systems by providing high performance, memory systems. In particular, various embodiments may be implemented with next generation LPDDR specification (LPDDR6) and associated double data rate memory (DDR) physical layer (PHY) chipsets used in mobile device or non-mobile computing devices.

FIG. 1 illustrates a system including a computing device 10 suitable for use with various embodiments. The computing device 10 may include a system-on-chip (SoC) 12 with a processor 14, a memory 16, a memory physical layer 34, a communication interface 18, a storage memory interface 20, a clock controller 30, and an interconnect 32. The computing device 10 may further include a communication component 22, such as a wired or wireless modem, a storage memory 24, an antenna 26 for establishing a wireless communication link, a power manager 28, and a memory 36. The processor 14 may include any of a variety of processing devices, for example a number of processor cores.

The term "system-on-chip" (SoC) is used herein to refer to a set of interconnected electronic circuits typically, but not exclusively, including a processing device, a memory, and a communication interface. A processing device may include a variety of different types of processors 14 and processor cores, such as a general purpose processor, a central processing unit (CPU), a digital signal processor (DSP), a graphics processing unit (GPU), an accelerated processing unit (APU), a secure processing unit (SPU), neural network processing unit (NPU), a subsystem processor of specific components of the computing device, such as an image processor for a camera subsystem or a display processor for a display, an auxiliary processor, a single-core processor, a multicore processor, a controller, and a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and time references. Integrated circuits may be configured such that the components of the integrated circuit reside on a single piece of semiconductor material, such as silicon.

An SoC 12 may include one or more processors 14. The computing device 10 may include more than one SoC 12, thereby increasing the number of processors 14 and processor cores. The computing device 10 may also include processors 14 that are not associated with an SoC 12. The processors 14 may each be configured for specific purposes that may be the same as or different from other processors 14 of the computing device 10. One or more of the processors 14 and processor cores of the same or different configurations may be grouped together. A group of processors 14 or processor cores may be referred to as a multi-processor cluster.

The computing device 10 may include any number and combination of memories, such as the memory 16 integral to the SoC 12 and the memory 36 separate from the SoC 12. Any of the memories 16, 36 may be a volatile or non-volatile memory configured for storing data and processor-executable code for access by the processor 14. The computing device 10 and/or SoC 12 may include one or more memories 16, 36 configured for various purposes. One or more memories 16, 36 may include volatile memories such as random access memory (RAM) or main memory, including static RAM (SRAM), such as the memory 16, dynamic RAM (DRAM), such as the memory 36, or cache memory. These memories 16, 34 may be configured to temporarily hold a limited amount of data received from a data sensor or subsystem, data and/or processor-executable code instructions that are requested from a non-volatile memory 16, 24, 36 loaded to the memories 16, 34 from the non-volatile memory 16, 24, 36 in anticipation of future access based on a variety of factors, and/or intermediary processing data and/or processor-executable code instructions produced by the processor 14 and temporarily stored for future quick access without being stored in non-volatile memory 16, 24, 36. The memory 16, 36 may be configured to store data and processor-executable code in parts of the memory 16, 36 configured to store data and processor-executable code for secure computing operations, referred to herein as a secure portion. The memory 16, 36 may be configured to store data and processor-executable code in parts of the memory 16, 36 configured to store data and processor-executable code for non-secure computing operations, referred to herein as a non-secure portion.

The memory physical layer 34 may work in unison with the memory 36 to enable the computing device 10 to store and retrieve data and processor-executable code on and from the memory 36. The memory physical layer 34 may control access to the storage memory 36 and allow the processor 14 to read data from and write data to the memory 36.

The storage memory interface 20 and the storage memory 24 may work in unison to allow the computing device 10 to store data and processor-executable code on a non-volatile storage medium. The storage memory 24 may be configured much like an embodiment of the memory 16 in which the storage memory 24 may store the data or processor-executable code for access by one or more of the processors 14. The storage memory 24, being non-volatile, may retain the information after the power of the computing device 10 has been shut off. When the power is turned back on and the computing device 10 reboots, the information stored on the storage memory 24 may be available to the computing device 10. The storage memory interface 20 may control access to the storage memory 24 and allow the processor 14 to read data from and write data to the storage memory 24.

The power manager 28 may be configured to control power states of and/or power delivery to the components of the SoC 12. In some embodiments, the power manager 28 may be configured to signal power states to the components of the SoC 12 to prompt the components of the SoC 12 to transition to the signaled power states. In some embodiments, the power manager 28 may be configured to control amounts of power provided to the components of the SoC 12. For example, the power manager 28 may be configured to control connections between components of the SoC 12 and power rails (not shown). As another example, the power manager 28 may be configured to control amounts of power on power rails connected to the components of the SoC 12.

A clock controller 30 may be configured to control clock signals transmitted to the components of the SoC 12. In some embodiments, the clock controller 30 may be configured to signal clock states, such as gated or ungated, to components of the SoC 12 to prompt the components of the SoC 12 to transition to the clock state. For example, a component of the SoC 12 may transition to a gated clock state in response to receiving a gated clock state signal from the clock controller 30 by disconnecting from a clock signal and may transition to an ungated clock state in response to receiving an ungated clock state signal from the clock controller 30 by connecting to the clock signal. In some embodiments, the clock controller 30 may be configured to control clock signals to components of the SoC 12. For example, the clock controller 30 may disconnect a component of the SoC 12 from a clock signal to transition the component of the SoC 12 to a gated clock state and may connect the component of the SoC 12 to the clock signal to transition the component of the SoC 12 to an ungated clock state.

The interconnect 32 may be a communication fabric, such as a communication bus, configured to communicatively connect the components of the SoC 12. The interconnect 32 may transmit signals between the components of the SoC 12. In some embodiments, the interconnect 32 may be configured to control signals between the components of the SoC 12 by controlling timing and/or transmission paths of the signals.

Some or all of the components of the computing device 10 and/or the SoC 12 may be arranged differently and/or combined while still serving the functions of the various embodiments. The computing device 10 may not be limited to one of each of the components, and multiple instances of each component may be included in various configurations of the computing device 10.

Figure 2A:
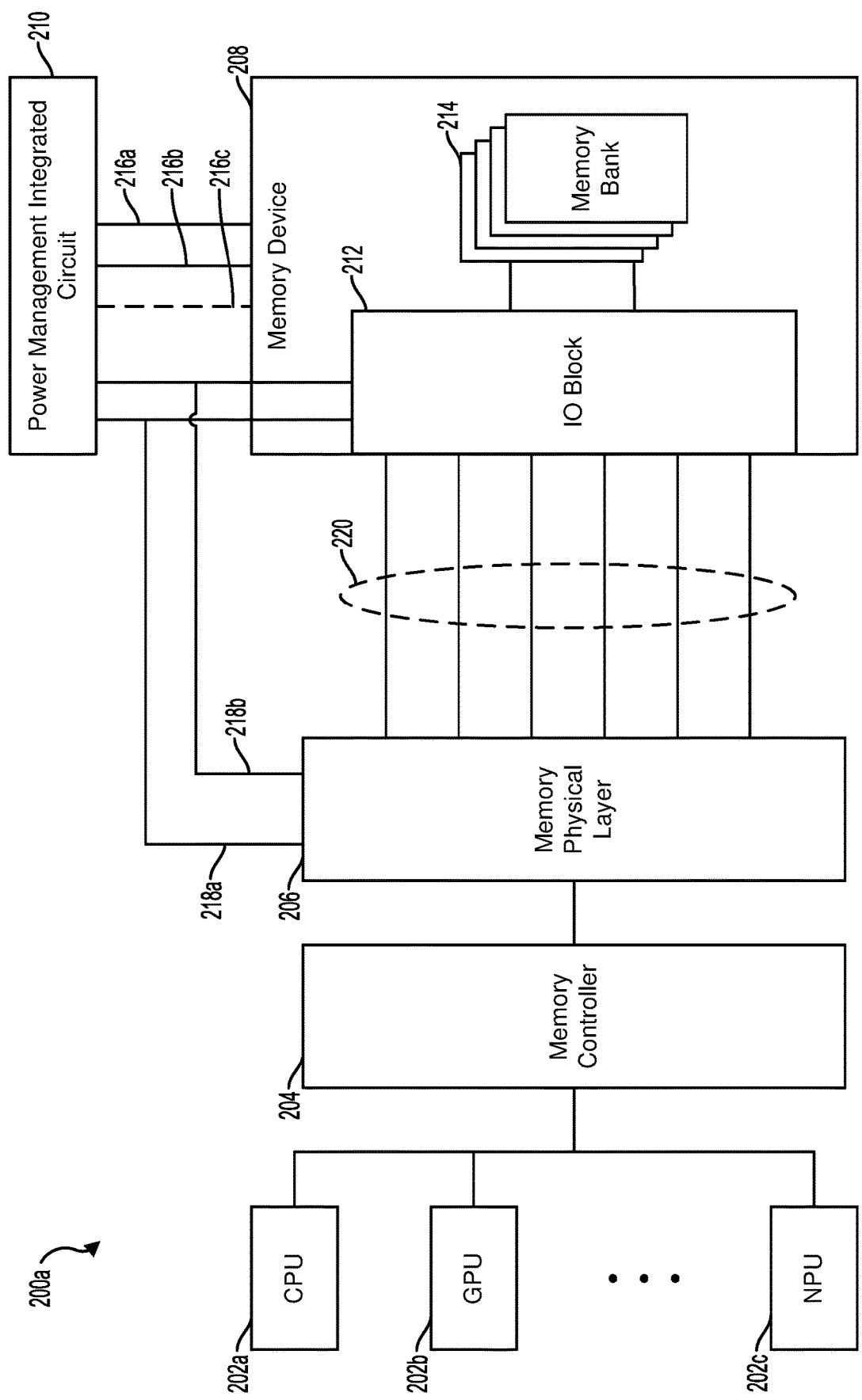
FIGS. 2A-2C are component block diagrams illustrating example memory system using dual input/output (IO) voltage supplies for implementing various embodiments.
Figure 2B:
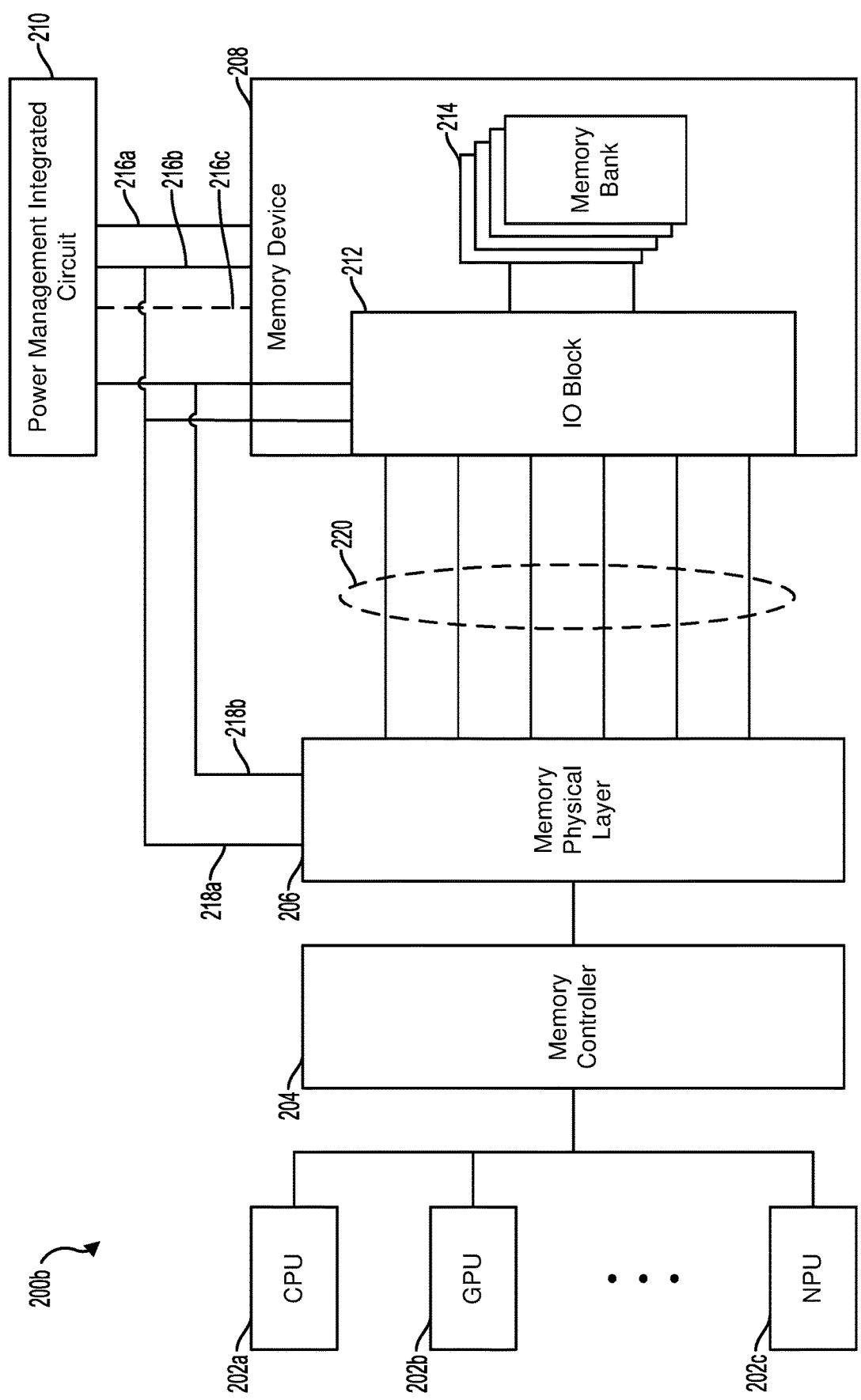
Figure 2C:
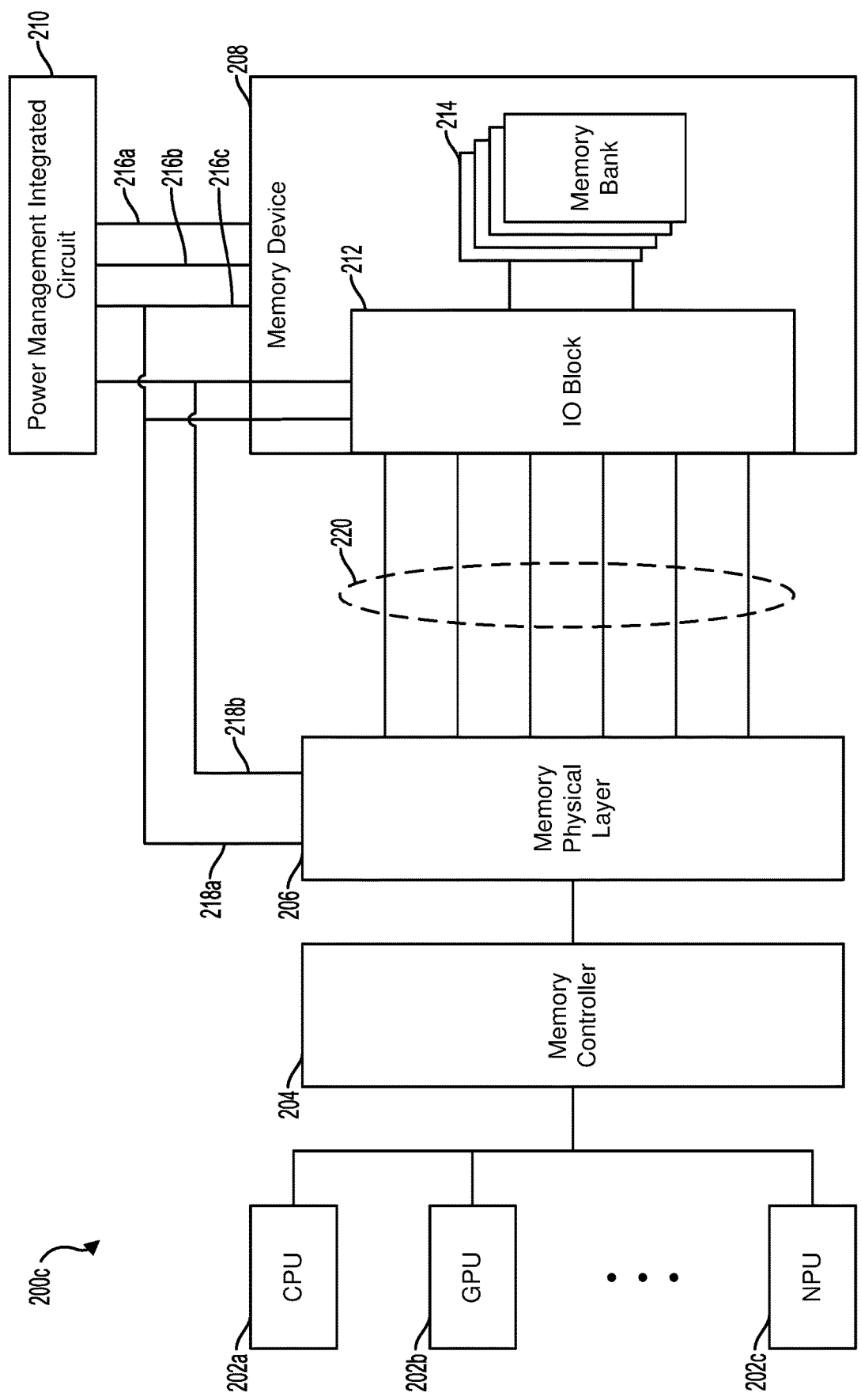

FIGS. 2A-2C illustrates examples of memory systems using dual input/output (IO) voltage supplies for implementing various embodiments. With reference to FIGS. 1-2C, a memory system 200a, 200b, 200c may be, in whole or in part, integral to an SoC (e.g., SoC 12 in FIG. 1). The memory system 200a, 200b, 200c may include a memory controller 204, a memory physical layer 206, any number and combination of memory devices 208 (e.g., memory 16, 24 in FIG. 1), and a power management integrated circuit (PMIC) 210 (e.g., power manager 28 in FIG. 1). The memory devices 208 may further include an IO block 212 and any number and combination of memory banks 214. The IO block 212 may be, for example, a 3 level pulse amplitude modulator.

The PMIC 210 may be configured to control and/or provide voltage to the memory device 208 and to the memory physical layer 206. The PMIC 210 may control and/or provide voltage to the memory device 208 via core voltage supplies 216a, 216b, 216c, which may also be referred to as rails, lines, etc. In some embodiments the core voltage supplies 216a, 216b, 216c may include a first core voltage supply 216a, and a second core voltage supply 216b and/or a third core voltage supply 216c. The core voltage supplies 216a, 216b, 216c may be electrically connected to internal circuitry of the memory device 208, such as the memory banks 214 or memory bitcell arrays (not shown) of the memory banks 214. The core voltage supplies 216a, 216b, 216c may be differently configured from each other to provide voltages, alone or in any combination, needed for the memory device 208 to perform any number and combination of functions, including storing, reading, writing, and/or retaining data. In some embodiments, the core voltage supplies 216a, 216b, 216c may be differently configured from each other to provide voltages, alone or in any combination, needed for the memory device 208 to perform any number and combination of the various functions at different speeds and/or for differently sized portions of the memory device 208. In an example including two core voltage supplies 216a, 216b, the first core voltage supply 216a may be greater than the second core voltage supply 216b. In an example including three core voltage supplies 216a, 216b, 216c, the first core voltage supply 216a may be greater than the second core voltage supply 216b, and the second core voltage supply 216b may be greater than the third core voltage supply 216c. As a specific and nonlimiting example, such as per the Joint Electron Device Engineering Council (JEDEC) LPDDR5 specification, the first core voltage supply 216a may be approximately 1.8V and the second core voltage supply 216b may be approximately 1.05V. As another specific and nonlimiting example, such as per the JEDEC LPDDR5 specification, the first core voltage supply 216a may be may be approximately 1.8V, the second core voltage supply 216b may be approximately 1.05V, and the third core voltage supply 216c may be approximately 0.9V.

The PMIC 210 may control and/or provide voltage to the memory device 208 and to the memory physical layer 206 via 10 voltage supplies 218a, 218b, which may also be referred to as rails, lines, etc. The IO voltage supplies 218a, 218b may be referred to herein together as dual IO voltage supplies. The dual IO voltage supplies 218a, 218b may include a high IO voltage supply and a low IO voltage supply in which the high IO voltage supply provides a higher voltage than the low IO voltage supply. The voltage provided to the memory device 208 and to the memory physical layer 206 via the dual IO voltage supplies 218a, 218b may enable the memory system 200a, 200b, 200c to implement a 3 level PAM IO scheme. In some embodiments, the voltage provided to the memory device 208 via the dual IO voltage supplies 218a, 218b may be provided to the IO block 212 of the memory device 208 to enable the memory device to implement the 3 level PAM IO scheme as described herein.

The memory device 208 and to the memory physical layer 206 may be communicatively connected via a communication bus 220. The communication bus 220 may be configured to transmit signals and data for implementing memory transactions between the memory device 208 and to the memory physical layer 206. For example, the communication bus 220 may include any number and combination of buses or lines for transmitting data, clock signals, command and address information, etc. In some embodiments, the communication bus 220 may be communicatively connected between the SoC and the memory device 208 external to the SoC. In some embodiments, implementing a 3 level PAM IO scheme using the dual IO voltage supplies 218a, 218b may decrease power for executing the same memory transactions as compared to IO schemes, such as a 3 level PAM IO scheme, using a single IO voltage supply. The low IO voltage supply of the dual IO voltage supplies 218a, 218b may provide a lower voltage than the single IO voltage supply, and use of the low IO voltage supply for executing the same memory transactions as the single IO voltage supply may enable the memory device 208 to use less power than executing the transactions using the voltage of the single IO voltage supply. In some embodiments, implementing a 3 level PAM IO scheme using the dual IO voltage supplies 218a, 218b may increase memory system bandwidth for executing the same memory transactions as compared to IO schemes using a single IO voltage supply. The 3 level PAM IO scheme may be implemented using a greater number of signal states, collectively referred to herein as states, based on the dual IO voltage supplies 218a, 218b than other IO schemes that use a single IO voltage supply. The greater number of signal states enables encoding a greater amount of data and information in 3 level PAM signals on the communication bus 220 than other IO schemes that use a single IO voltage supply.

In some embodiments, the memory system 200a, 200b, 200c may receive memory transactions from any number and combination of processors 202a, 202b, 202c (e.g., processor 14 in FIG. 1). The memory system 200a, 200b, 200c may execute a memory transaction received from a processor 202a, 202b, 202c and/or provide a response of the executed memory transaction to the processor 202a, 202b, 202c.

In the example illustrated in FIG. 2A, the memory system 200a may include dedicated IO voltage supplies 218a, 218b providing the two voltage levels. The PMIC 210 may control and/or provide designated voltages of each of the dedicated dual IO voltage supplies 218a, 218b to the memory device 208 and to the memory physical layer 206 via individual ones of the dual IO voltage supplies 218a, 218b.

In the example illustrated in FIG. 2B, the memory system 200c may include a shared IO voltage supply 218a and a dedicated IO voltage supply 218b, with the combination providing the two voltage levels. The shared IO voltage supply 218a may share a common voltage with the second core voltage supply 216b by electrical connection to the second core voltage supply 216b. The PMIC 210 may control and/or provide a designated voltage of the shared dual IO voltage supply 218a to the memory device 208 and to the memory physical layer 206 via controlling and/or providing the designated voltage on the second core voltage supply 216b. The PMIC 210 may control and/or provide a designated voltage the dedicated IO voltage supply 218b to the memory device 208 and to the memory physical layer 206 via the individual dedicated IO voltage supply 218b.

In the example illustrated in FIG. 2C, the memory system 200c may include a shared IO voltage supply 218a and a dedicated IO voltage supply 218b, with the combination providing the two voltage levels. The shared IO voltage supply 218a may share a common voltage with the third core voltage supply 216c by electrical connection to the third core voltage supply 216c. The PMIC 210 may control and/or provide a designated voltage of the shared dual IO voltage supply 218a to the memory device 208 and to the memory physical layer 206 via controlling and/or providing the designated voltage on the third core voltage supply 216c. The PMIC 210 may control and/or provide a designated voltage the dedicated IO voltage supply 218b to the memory device 208 and to the memory physical layer 206 via the individual dedicated IO voltage supply 218b.

Figure 3:
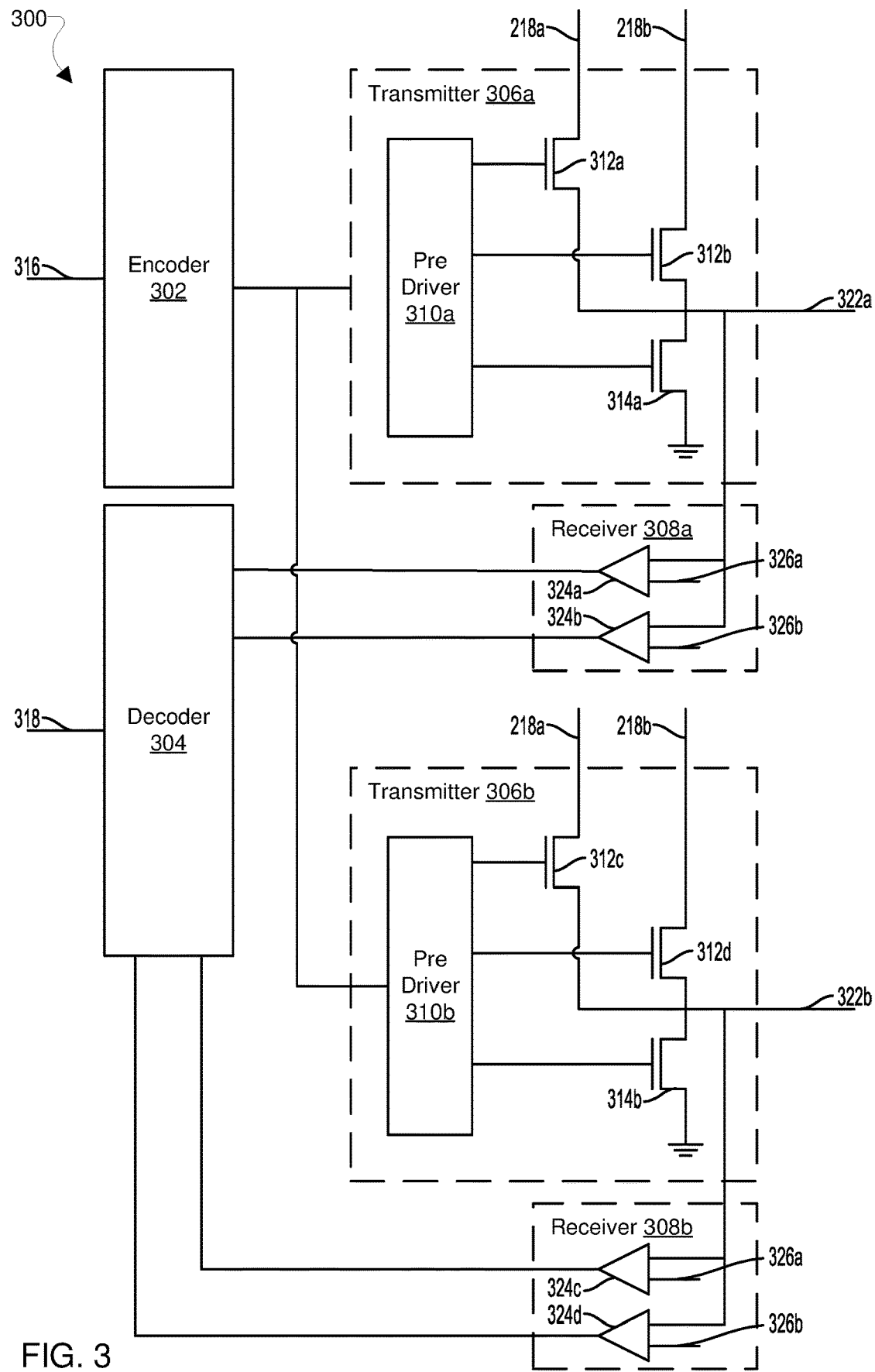
FIG. 3 is a component block diagram illustrating an example dual IO voltage 3 level pulse amplitude modulation (PAM or PAM-3) IO structure for implementing various embodiments.

FIG. 3 is a circuit block diagram illustrating an example dual IO voltage 3 level PAM IO structure for implementing various embodiments. With reference to FIGS. 1-3, a dual IO voltage 3 level PAM IO structure 300 (e.g., memory physical layer 206, IO block 212 in FIGS. 2A-2C) may include an encoder 302, a decoder 304, and any number and combination of 3 level PAM transmitters 306a, 306b, and 3 level PAM receivers 308a, 308b. In some embodiments, the dual IO voltage 3 level PAM IO structure 300 may include two 3 level PAM transmitters 306a, 306b and two 3 level PAM receivers 308a, 308b. The 3 level PAM transmitters 306a, 306b may be electrically connected to the dual IO voltage supplies 218a, 218b. In some embodiments, the dual IO voltage supplies 218a, 218b may be two dedicated IO voltage supplies 218a, 218b. In some embodiments, the dual IO voltage supplies 218a, 218b may be a shared IO voltage supply 218a and a dedicated IO voltage supply 218b. In some embodiments, the 3 level PAM transmitters 306a, 306b and 3 level PAM receivers 308a, 308b may be communicatively connected.

Via an input 316, the encoder 302 may receive data and/or information for transmission as part of a memory transaction. The encoder 302 may receive the data and/or information as binary signals. The encoder 302 may encode the binary signals into transmitter input signals for generating 3 level PAM signals. For example, the encoder 302 may encode three binary signals into the transmitter input signals for two 3 level PAM transmitters 306a, 306b. The transmitter input signals may be output by the encoder 302 to the 3 level PAM transmitters 306a, 306b.

The 3 level PAM transmitters 306a, 306b may receive the transmitter input signals from the encoder 302, and generate and output the 3 level PAM signals. The 3 level PAM transmitters 306a, 306b may include pre-drivers 310a, 310b, pull up circuits 312a, 312b, 312c, 312d, which are referred to herein as "pull ups," and pull down circuits 314a, 314b, which are referred to herein as "pull downs." The pull ups 312a, 312b, 312c, 312d may be electrically connected to the dual TO voltage supplies 218a, 218b. For example, the pull ups 312a, 312b, 312c, 312d may each be electrically connected to one of the dual TO voltage supplies 218a, 218b, and the pull ups 312a, 312b, 312c, 312d of the same 3 level PAM transmitters 306a, 306b may each be electrically connected to a different one of the dual TO voltage supplies 218a, 218b. As another example, the pull ups 312a, 312c may be electrically connected to the TO voltage supply 218a, and the pull ups 312b, 312d may be electrically connected to the TO voltage supply 218b. The pull downs 314a, 314b may be selectively electrically connected to the dual TO voltage supplies 218a, 218b via the pull ups 312a, 312b, 312c, 312d. For example, the pull down 314a may be selectively electrically connected to the TO voltage supply 218a via the pull up 312a and selectively electrically connected to the TO voltage supply 218b via the pull up 312b. The pull down 314b may be selectively electrically connected to the TO voltage supply 218a via the pull up 312c and selectively electrically connected to the TO voltage supply 218b via the pull up 312d.

The 3 level PAM transmitters 306a, 306b may output the 3 level PAM signals via outputs 322a, 322b. The outputs 322a, 322b may be selectively electrically connected to the dual IO voltage supplies 218a, 218b via the pull ups 312a, 312b, 312c, 312d and selectively electrically connected to ground via the pull downs 314a, 314b. For example, the output 322a may be selectively electrically connected to the IO voltage supply 218a via the pull up 312a, selectively electrically connected to the IO voltage supply 218b via the pull up 312b, and selectively electrically connected to ground via the pull down 314a. The output 322b may be selectively electrically connected to the IO voltage supply 218a via the pull up 312c, selectively electrically connected to the IO voltage supply 218b via the pull up 312d, and selectively electrically connected to ground via the pull down 314b.

The pre drivers 310a, 310b may interpret the received transmitter input signals and accordingly control the pull ups 312a, 312b, 312c, 312d and the pull downs 314a, 314b to selectively electrically connect the outputs 322a, 322b to the dual IO voltage supplies 218a, 218b or ground to generate and output state signals. For example, the pre driver 310a may interpret the received transmitter input signals and accordingly control the pull ups 312a, 312b and the pull down 314a to selectively electrically connect the output 322a to the dual IO voltage supplies 218a, 218b or ground. The pre driver 310b may interpret the received transmitter input signals and accordingly control the pull ups 312c, 312d and the pull down 314b to selectively electrically connect the output 322b to the dual IO voltage supplies 218a, 218b or ground.

In some embodiments, the 3 level PAM transmitters 306a, 306b may generate and output up to nine state signals based on the selective connection of the outputs 322a, 322b to the dual IO voltage supplies 218a, 218b or ground. For example, each 3 level PAM transmitter 306a, 306b may generate and output three level signals (e.g., high "H", medium "M", and low "L"). The 3 level PAM signals output by each 3 level PAM transmitter 306a, 306b may be combined as any of the up to nine state signals.

The 3 level PAM receivers 308a, 308b may receive the 3 level PAM signals, and generate and output receiver output signals. The 3 level PAM receivers 308a, 308b may include comparator circuits 324a, 324b, 324c, 324d configured to compare the received 3 level PAM signals and voltage reference signals 326a, 326b. For example, the comparator circuits 324a, 324c may be configured to compare whether states of the received 3 level PAM signals are less than the voltage reference signal 326a. As another example, the comparator circuits 324b, 324d may be configured to compare whether states of the received 3 level PAM signals are less than, or greater than, the voltage reference signal 326b. In such examples, the voltage reference signal 326a may be greater than the voltage reference signal 326b. The results of the comparisons may prompt the comparator circuits 324a, 324b, 324c, 324d to output receiver output signals of values that represent the states of received 3 level PAM signals.

The decoder 304 may receive the receiver output signals from the 3 level PAM receivers 308a, 308b, and generate and output data and/or information of the memory transaction. The decoder 304 may decode the receiver output signals to generate the binary signals as received by the encoder 302. The decoder 304 may output the binary signals via an output 318.

In some embodiments, the encoder 302 and the 3 level PAM transmitters 306a, 306b outputting the 3 level PAM signals, and the decoder 304 and the 3 level PAM receivers 308a, 308b receiving the 3 level PAM signals may be parts of different dual IO voltage 3 level PAM IO structures 300. For example, the encoder 302 and the 3 level PAM transmitters 306a, 306b may be part of a memory physical layer, and the decoder 304 and the 3 level PAM receivers 308a, 308b may be part of an IO block. As another example, the encoder 302 and the 3 level PAM transmitters 306a, 306b may be part of an IO block, and the decoder 304 and the 3 level PAM receivers 308a, 308b may be part of a memory physical layer.

Figure 4:
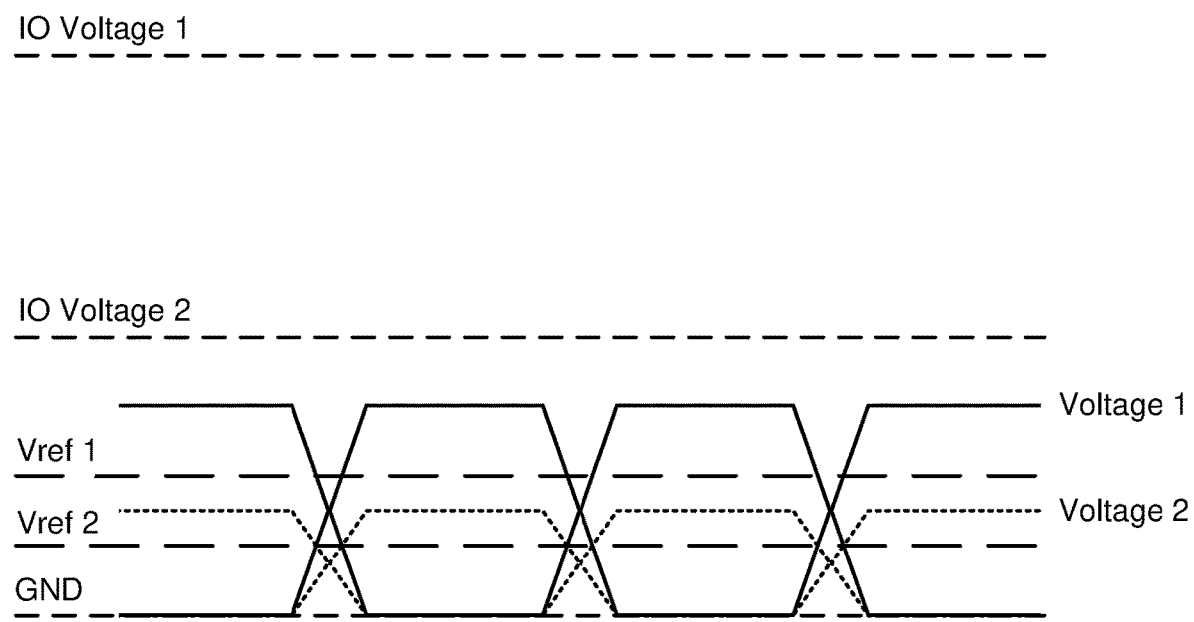
FIG. 4 is a signal timing diagram illustrating an example dual IO voltage 3 level PAM voltage level signals for implementing various embodiments.

FIG. 4 illustrates an example dual IO voltage 3 level PAM timing diagram for implementing various embodiments. With reference to FIGS. 1-4, the timing diagram includes an IO voltage 1 (e.g., voltage of one of IO voltage supply 218a, 218b in FIGS. 2A-3), an IO voltage 2 (e.g., voltage of the other of IO voltage supply 218a, 218b in FIGS. 2A-3), a ground voltage ("GND") (e.g., ground in FIG. 3), a voltage reference 1 ("Vref 1") (e.g., voltage of one of voltage reference signal 326a, 326b in FIG. 3), and a voltage reference 2 ("Vref 2") (e.g., voltage of the other of voltage reference signal 326a, 326b in FIG. 3).

As described herein, a dual IO voltage 3 level PAM IO structure (e.g., dual IO voltage 3 level PAM IO structures 300 in FIG. 3) may encode and output and/or receive and decode 3 level signals (e.g., high "H", medium "M", and low "L"). The value of a signal may depend on the control of the selective connections of 3 level PAM transmitters (e.g., 3 level PAM transmitters 306a, 306b in FIG. 3) to IO voltage supplies (e.g., IO voltage supplies 218a, 218b in FIGS. 2A-3). A high signal may result from selective electrical connection to a high IO voltage supply that may supply a high level voltage ("voltage 1"). A medium signal may result from a selective electrical connection to a low IO voltage supply that may supply a medium level voltage ("voltage 2"). A low signal may result from a selective electrical connection to ground. The dual IO voltage 3 level PAM IO structure may determine the type, value, level, or state of the 3 level PAM signal by comparison with Vref 1 and/or Vref 2. For example, 3 level PAM receivers (e.g., 3 level PAM receivers 308a, 308b in FIG. 3) of the dual IO voltage 3 level PAM IO structure may determine the type, value, level, or state of the 3 level PAM signal.

In some embodiments, the medium level voltage affects both high and medium signal timing and voltage margin. The low IO voltage supply level from a PMIC (e.g., PMIC 210 in FIGS. 2a-2C) may be adjusted globally to balance between high and medium signal timing and voltage margin during Write & Read data training in a computing device (e.g., computing device 10 in FIG. 1). An SoC (e.g., SoC 12 in FIG. 1) may provide certain control signals to the PMIC to adjust the low IO voltage supply.

FIG. 5 illustrate an example of 3 level PAM coding for implementing various embodiments. With reference to FIGS. 1-5, the table 500 illustrated in FIG. 5 shows an example of potential mapping between binary signals and 3 level PAM signals for encoding and decoding between the binary signals and 3 level PAM signals by an encoder (e.g., encoder 302 in FIG. 3) and a decoder (e.g., decoder 304 in FIG. 3). The table 500 includes the binary signal values high "H" and low "L", and the 3 level PAM signal values high "H", medium "M", and low "L". In this example, three binary signals may each have one of two values for a total of eight possible combinations. The corresponding two 3 level PAM signals may each have one of three values. There may be nine possible combinations of 3 level PAM signals. However, the number of combinations of 3 level PAM signals is limited by the number of possible combinations of binary signals. Each combination of three binary signals may correspond to a combination of two 3 level PAM signals. In the illustrated example, the "HH" combination of 3 level PAM signals is omitted as it is the most power intensive. However, the claims and descriptions are not intended to be limited in scope by the example shown in FIG. 5.

Figure 6A:
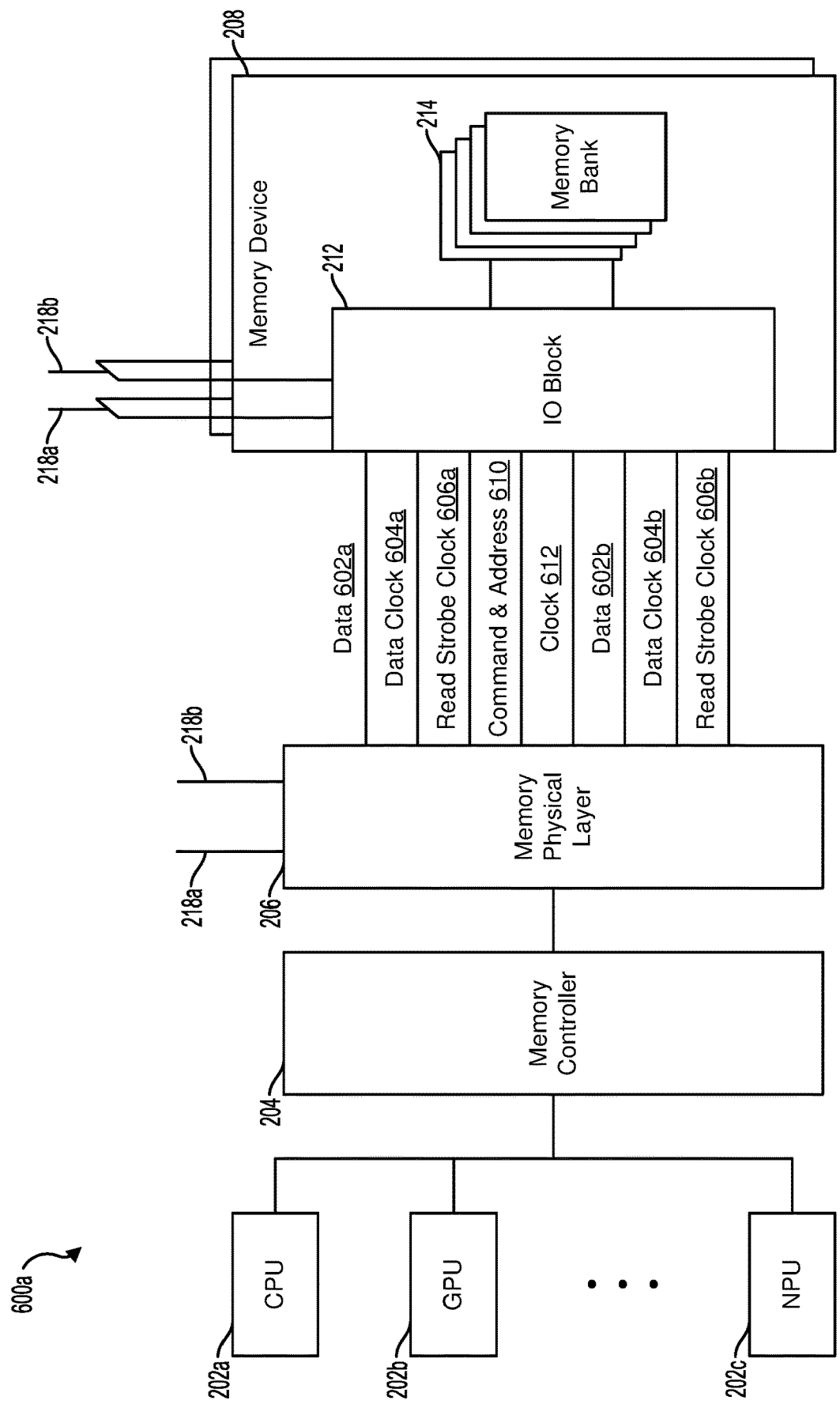
FIGS. 6A and 6B are component block diagrams illustrating example dual IO voltage memory system interfaces for 3 level PAM IO schemes for implementing various embodiments.
Figure 6B:
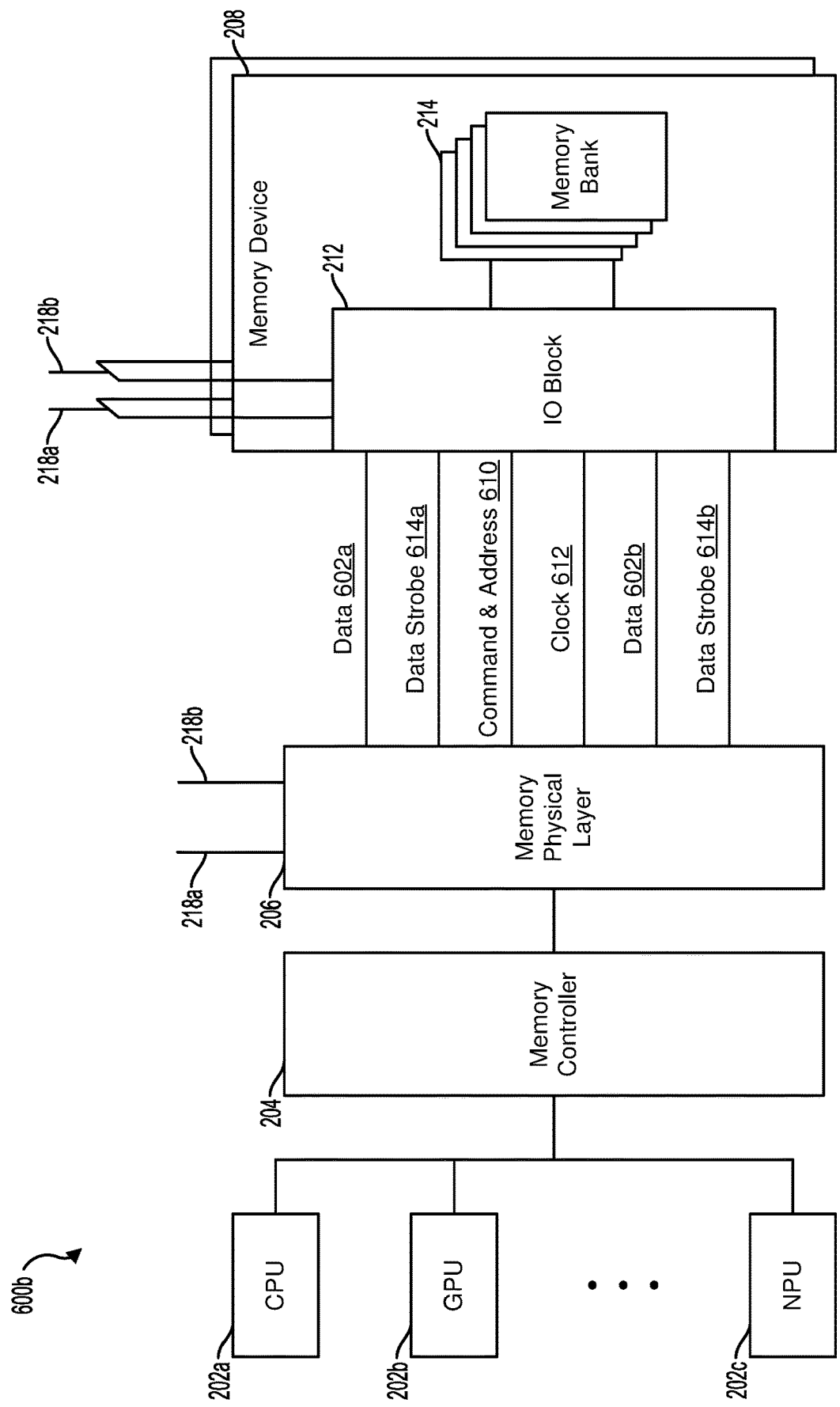

FIGS. 6A and 6B illustrate example dual IO voltage memory system interfaces for 3 level PAM IO schemes for implementing various embodiments. With reference to FIGS. 1-6B, a dual IO voltage memory system interface for 3 level PAM IO schemes 600a, 600b may be implemented by various components of a memory system (e.g., memory system 200a, 200b, 200c in FIGS. 2A-2C). Such components may include a memory physical layer 206, any number and combination of memory devices 208, dual IO voltage supplies 218a, 218b, and a communication bus (e.g., communication bus 220 in FIGS. 2A-2C). In some embodiments, the communication bus may include any number and combination of data buses 602a, 602b, data clock buses 604a, 604b, read strobe clocks buses 606a, 606b, a command and address bus 610, a clock bus 612, and data strobe buses 614a, 614b.

The data buses 602a, 602b may vary in size. In some embodiments, the data buses 602a, 602b may be configured to transmit a same amount of data and/or information for a memory transaction as a single IO voltage memory system interface. In such embodiments, the dual IO voltage 3 level PAM IO scheme may encode more data per line of the data buses 602a, 602b based on having extra possible signal types, values, levels, or states. As such, the data buses 602a, 602b may be implemented with fewer lines compared to a single IO voltage memory system interface. For example, a data bus for a single IO voltage memory system interface may include eight binary data bit lines and binary function bit line (e.g., an error correction code parity bit line). Various binary bits may be encoded into fewer 3 level PAM signal bits, as described further herein. For example, three binary bits may be encoded as two 3 level PAM signal bits. Thus, nine binary bits may be reduced to six 3 level PAM signal bits and the number of lines of the data buses 602a, 602b may be reduced accordingly for a dual IO voltage memory system interface for 3 level PAM IO schemes 600a, 600b.

In some embodiments, the data buses 602a, 602b may be configured to transmit more data and/or information for a memory transaction as a single IO voltage memory system interface. In other words, the data buses 602a, 602b may have a higher bandwidth. In such embodiments, the dual IO voltage 3 level PAM IO scheme may transmit more data over more lines of the data buses 602a, 602b without incurring extra power cost based on using lower power 3 level PAM signals than single IO voltage memory system interface. For example, a data bus for a single IO voltage memory system interface may include eight binary data bit lines and binary function bit line (e.g., an error correction code parity bit line). Various binary bits may be encoded into fewer 3 level PAM signal bits, as described further herein. For example, three binary bits may be encoded as two 3 level PAM signal bits. Thus, nine binary bits may be reduced to six 3 level PAM signal bits. The bandwidth of the data buses 602a, 602b may be doubled in comparison to the single IO voltage memory system interface by increasing the number of lines of the data buses 602a, 602b to twelve lines for a dual IO voltage memory system interface for 3 level PAM IO schemes 600a, 600b.

In some embodiments, the dual IO voltage memory system interface for 3 level PAM IO schemes 600a, 600b may be configured for different clock schemes. For example, the dual IO voltage memory system interface for 3 level PAM IO schemes 600a illustrated in FIG. 6A includes data clock buses 604a, 604b and read strobe clocks buses 606a, 606b of an LPDDR5 scheme. As another example, the dual IO voltage memory system interface for 3 level PAM IO schemes 600b illustrated in FIG. 6B includes data strobe buses 614a, 614b of an LPDDR4 scheme.

Figure 7:
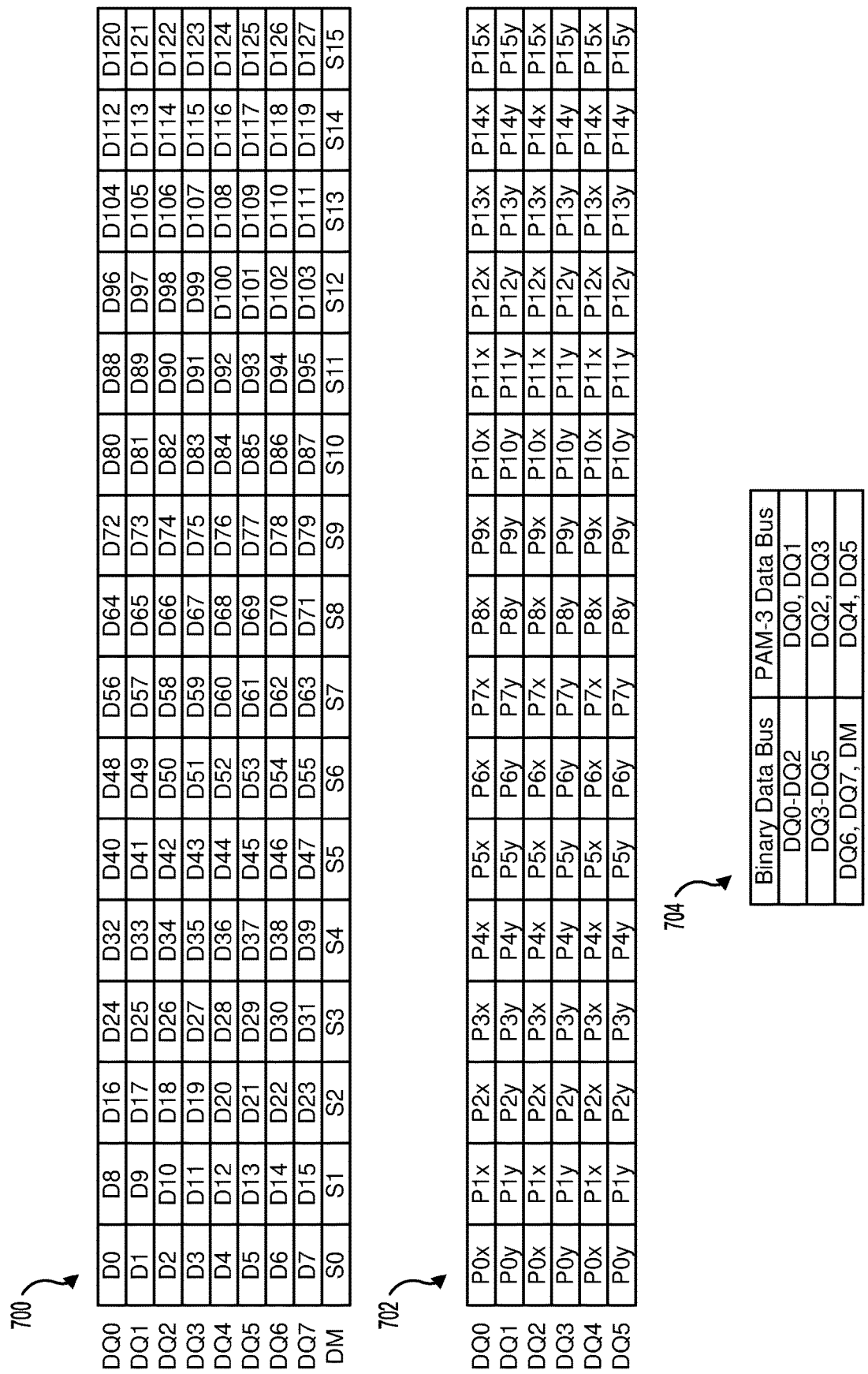
FIG. 7 is a set of tables illustrating an example of signal allocation in a dual IO voltage memory system interface for 3 level PAM IO schemes for implementing various embodiments.

FIG. 7 illustrates an example of signal allocations in a dual IO voltage memory system interface for 3 level PAM IO schemes for implementing various embodiments. With reference to FIGS. 1-7, example table 700, 702, 704 list signal allocations to data buses (e.g., communication bus 220 in FIGS. 2A-2C, data buses 602a, 602b in FIGS. 6A and 6B) in a dual IO voltage memory system interface for 3 level PAM IO schemes. As described herein, binary bits may be encoded into fewer 3 level PAM signal bits. As such, the data buses may be implemented with fewer lines compared to a single IO voltage memory system interface. Table 700 shows signal allocations of a burst of data of a memory transaction for a single IO voltage memory system interface using a nine line data bus. Table 702 shows signal allocations of a burst of data of a memory transaction for a dual IO voltage memory system interface for 3 level PAM IO schemes using a six line data bus. Table 704 shows the mapping between the lines of a data bus for single IO voltage memory system interface and the lines of a data bus for a dual IO voltage memory system interface for 3 level PAM IO schemes. Using the mapping shown in table 704, the comparison of table 700 and table 702 shows the signal allocation in tables 700 and 702 are for equivalent data bursts using different signaling and different size data buses. The signal allocation in table 702 allocates the equivalent data burst using fewer lines than the allocation in table 700. In the example in FIG. 7, the table 704 and the comparison of table 700 and 702 show a reduction ratio of 3:2. However, the claims and descriptions are not limited in scope by the example of FIG. 7.

Figure 8:
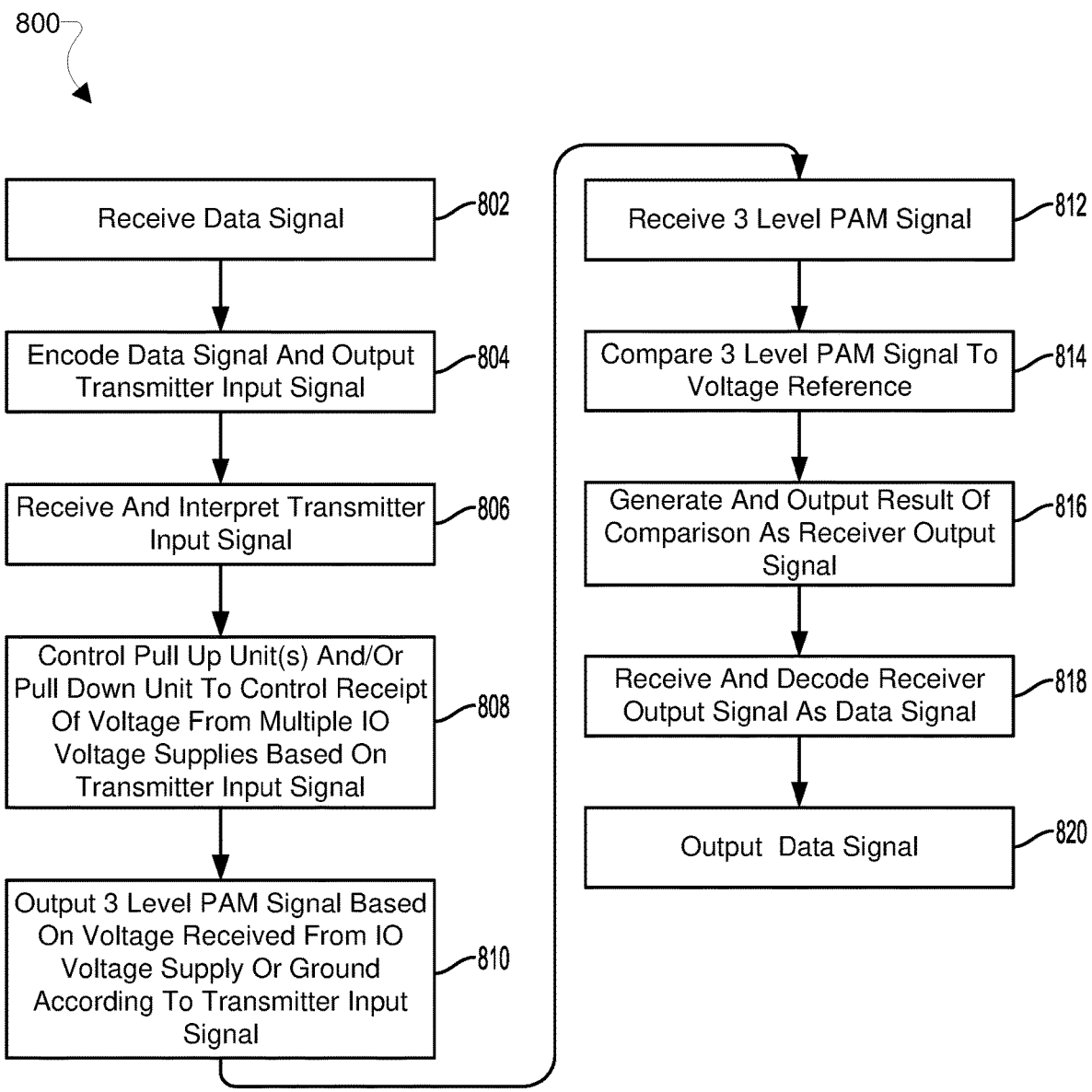
FIG. 8 is a process flow diagram illustrating a method for dual IO voltage 3 level PAM IO according to some embodiments.

FIG. 8 illustrates a method 800 for a method for dual IO voltage 3 level PAM IO according to an embodiment. With reference to FIGS. 1-8, the method 800 may be implemented in a computing device (e.g., computing device 10 in FIG. 1), in software executing in a processor (e.g., processor 14, in FIG. 1), in general purpose hardware, in dedicated hardware (e.g., memory 16, 24 in FIG. 1, memory system 200a, 200b, 200c, memory physical layer 206, memory device 208, IO block 212 in FIGS. 2A-2C, dual IO voltage 3 level PAM IO structure 300, encoder 302, decoder 304, 3 level PAM transmitter 306a, 306b, and 3 level PAM receiver 308a, 308b, pre driver 310a, 310b, comparator circuits 324a, 324b, 324c, 324d in FIG. 3), or in a combination of a software-configured processor and dedicated hardware, such as a processor executing software within a memory power control system that includes other individual components, and various memory/cache controllers. In order to encompass the alternative configurations enabled in various embodiments, the hardware implementing the method 800 is referred to herein as a "dual IO voltage controller."

In block 802, dual IO voltage controller may receive a data signal. The data signal may be part of a received memory transaction from any number and combination of processors (e.g., processor 202a, 202b, 202c in FIGS. 2A-2C). In some embodiments, the data signal may be a binary signal. In some embodiments, the dual IO voltage controller receiving the data signal in block 802 may be a memory physical layer, an IO block, and/or an encoder.

In block 804, the dual IO voltage controller may encode the data signal as a transmitter input signal for generating a 3 level PAM signal and output the transmitter input signal. For example, the dual IO voltage controller may encode three binary signals into two groups of transmitter input signals for generating 3 level PAM signals. The binary signals may be represented by high and low values and the transmitter input signals may be translated as high, medium, and low signals. A combination of binary signal bits may be encoded into fewer 3 level PAM signals. In some embodiments, the dual IO voltage controller encoding the data signal as the transmitter input signal for generating a 3 level PAM signal and outputting the transmitter input signal in block 804 may be a memory physical layer, an IO block, and/or an encoder.

In block 806, the dual IO voltage controller may receive and interpret the transmitter input signal. The transmitter input signals may be configured as control signals for selective electrical connection of an output of the dual IO voltage controller (e.g., output 322a, 322b in FIG. 3) to dual IO voltage supplies (e.g., dual IO voltage supplies 218a, 218b in FIGS. 2A-2C and 3) and/or ground. In some embodiments, the dual IO voltage controller receiving and interpreting the transmitter input signal in block 806 may be a memory physical layer, an IO block, a 3 level PAM transmitter, and/or a pre driver.

In block 808, the dual IO voltage controller may control a pull up unit(s) (e.g., pull up 312a, 312b, 312c, 312d in FIG. 3) and/or a pull down unit (e.g., pull down 314a, 314b in FIG. 3) to control receipt of voltage from the dual IO voltage supplies based on the transmitter input signal. The dual IO voltage controller may signal control signals to the pull up unit(s) to selectively electrically connect the output to the dual IO voltage supplies. The dual IO voltage controller may signal control signals to the pull down unit to selectively electrically connect the output to ground. The voltage received at the output in response to the selective electrical connection to the dual IO voltage supplies and/or ground may be a 3 level PAM signal derived from the data signal through encoding of the data signal to the transmitter input signal. In some embodiments, a signal state of the 3 level PAM signal may be high in response to selective electrical connection to a high IO voltage supply of the dual IO voltage supplies, medium in response to selective electrical connection to a low IO voltage supply of the dual IO voltage supplies, and low in response to selective electrical connection to ground. In some embodiments, the dual IO voltage controller controlling the pull up unit(s) and/or the pull down unit to control receipt of voltage from the dual IO voltage supplies based on the transmitter input signal in block 808 may be a memory physical layer, an IO block, a 3 level PAM transmitter, and/or a pre driver.

In block 810, the dual IO voltage controller may output the 3 level PAM signal based on the voltage received from the IO voltage supply or ground according to the transmitter input signal. The dual IO voltage controller may output the 3 level PAM signal having a signal state resulting from the selective electrical connection of the output to the dual IO voltage supplies and/or ground via the pull up unit(s) and/or the pull down unit. In some embodiments, the dual IO voltage controller outputting the 3 level PAM signal based on the voltage received from the IO voltage supply or ground according to the transmitter input signal in block 810 may be a memory physical layer, an IO block, and/or a 3 level PAM transmitter.

In block 812, the dual IO voltage controller may receive the 3 level PAM signal. The output 3 level PAM signal may be targeted to a receiving device based on the target of the memory transaction and/or return of the memory transaction. The target of the memory transaction and/or return of the memory transaction may receive the output 3 level PAM signal. In some embodiments, the dual IO voltage controller receiving the 3 level PAM signal in block 812 may be a memory physical layer, an IO block, a 3 level PAM receiver, and/or a comparator circuit.

In block 814, the dual IO voltage controller may compare the 3 level PAM signal to a voltage reference (e.g., voltage reference signals 326a, 326b in FIG. 3). For example, the dual IO voltage controller may compare whether the received 3 level PAM signal is less than a high voltage reference signal. As another example, the dual IO voltage controller may compare whether the received 3 level PAM signal is less than, or greater than, a low voltage reference signal. In such examples, the high voltage reference signal may be greater than the low voltage reference signal. In some embodiments, the dual IO voltage controller comparing the 3 level PAM signal to the voltage reference in block 814 may be a memory physical layer, an IO block, a 3 level PAM receiver, and/or a comparator circuit.

In block 816, the dual IO voltage controller may generate and output the result of the comparison as a receiver output signal. The receiver output signal resulting from the comparison may be configured to describe the state of the received 3 level PAM signal. In some embodiments, the dual IO voltage controller generating and outputting the result of the comparison as the receiver output signal in block 816 may be a memory physical layer, an IO block, a 3 level PAM receiver, and/or a comparator circuit.

In block 818, the dual IO voltage controller may receive and decode the receiver output signal as a data signal. The data signal resulting from decoding the receiver output signal may be the data signal received in block 802. In some embodiments, the dual IO voltage controller receiving and decoding the receiver output signal as a data signal in block 818 may be a memory physical layer, an IO block, and/or a decoder.

In block 820, the dual IO voltage controller may output the data signal. In some embodiments, the data signal may be output to a memory device. In some embodiments, the data signal may be output to a processor, such as via a memory controller. In some embodiments, the dual IO voltage controller outputting the data signal in block 820 may be a memory physical layer, an IO block, and/or a decoder.

Figure 9:
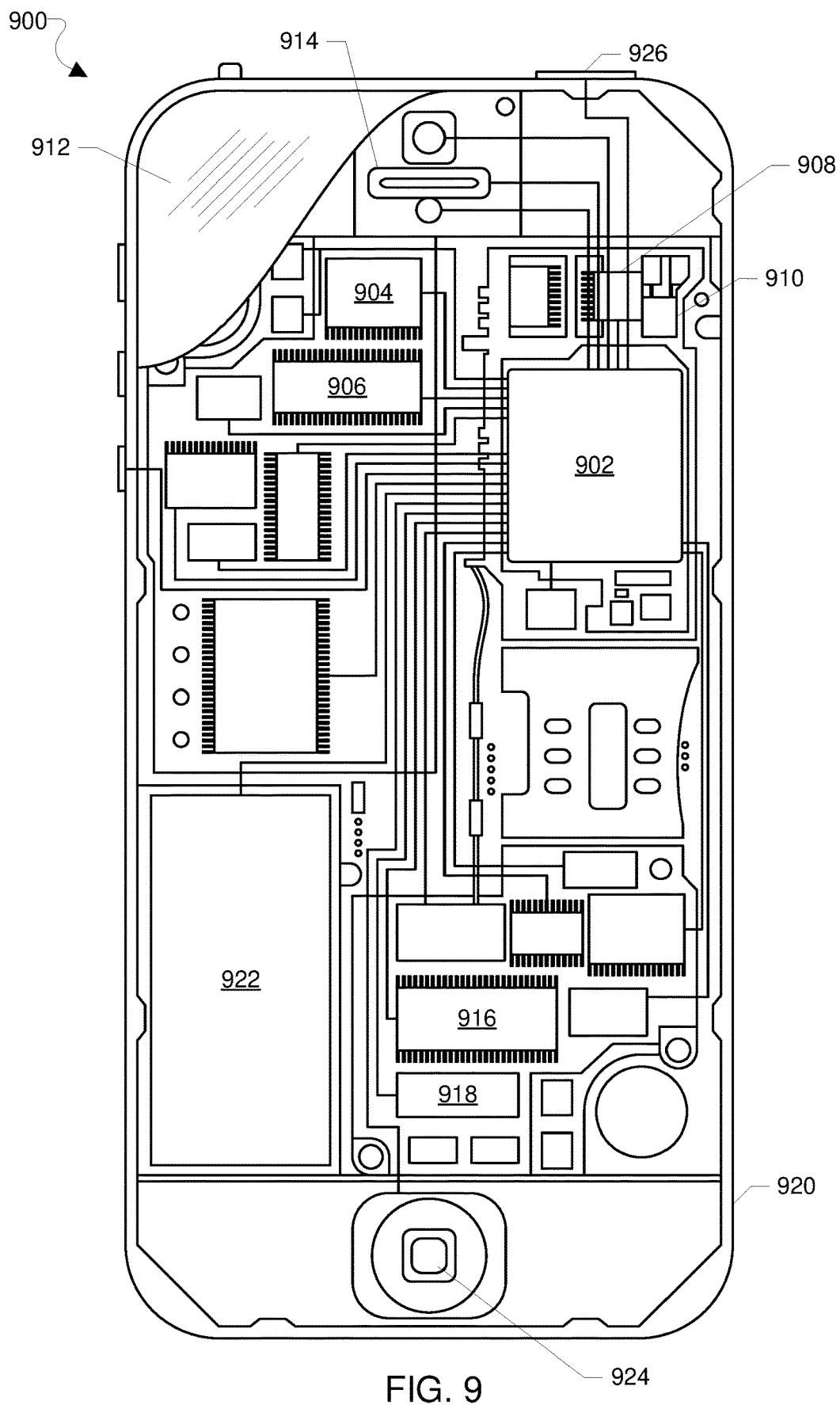
FIG. 9 is a component block diagram illustrating an example mobile computing device suitable for implementing various embodiments.

Various embodiments (including, but not limited to, embodiments described above with reference to FIGS. 1-8) may be implemented in a wide variety of computing systems including mobile computing devices, an example of which suitable for use with the various embodiments is illustrated in FIG. 9. The mobile computing device 900 may include a processor 902 coupled to a touchscreen controller 904 and an internal memory 906. The processor 902 may be one or more multicore integrated circuits designated for general or specific processing tasks. The internal memory 906 may be volatile or non-volatile memory, and may also be secure and/or encrypted memory, or unsecure and/or unencrypted memory, or any combination thereof. Examples of memory types that can be leveraged include but are not limited to DDR, LPDDR, GDDR, WIDEIO, RAM, SRAM, DRAM, P-RAM, R-RAM, M-RAM, STT-RAM, and embedded DRAM. The touchscreen controller 904 and the processor 902 may also be coupled to a touchscreen panel 912, such as a resistive-sensing touchscreen, capacitive-sensing touchscreen, infrared sensing touchscreen, etc. Additionally, the display of the mobile computing device 900 need not have touch screen capability.

The mobile computing device 900 may have one or more radio signal transceivers 908 (e.g., Peanut, Bluetooth, Zig-Bee, Wi-Fi, RF radio) and antennae 910, for sending and receiving communications, coupled to each other and/or to the processor 902. The transceivers 908 and antennae 910 may be used with the above-mentioned circuitry to implement the various wireless transmission protocol stacks and interfaces. The mobile computing device 900 may include a cellular network wireless modem chip 916 that enables communication via a cellular network and is coupled to the processor.

The mobile computing device 900 may include a peripheral device connection interface 918 coupled to the processor 902. The peripheral device connection interface 918 may be singularly configured to accept one type of connection, or may be configured to accept various types of physical and communication connections, common or proprietary, such as Universal Serial Bus (USB), FireWire, Thunderbolt, or PCIe. The peripheral device connection interface 918 may also be coupled to a similarly configured peripheral device connection port (not shown).

The mobile computing device 900 may also include speakers 914 for providing audio outputs. The mobile computing device 900 may also include a housing 920, constructed of a plastic, metal, or a combination of materials, for containing all or some of the components described herein. The mobile computing device 900 may include a power source 922 coupled to the processor 902, such as a disposable or rechargeable battery. The rechargeable battery may also be coupled to the peripheral device connection port to receive a charging current from a source external to the mobile computing device 900. The mobile computing device 900 may also include a physical button 924 for receiving user inputs. The mobile computing device 900 may also include a power button 926 for turning the mobile computing device 900 on and off.

Figure 10:
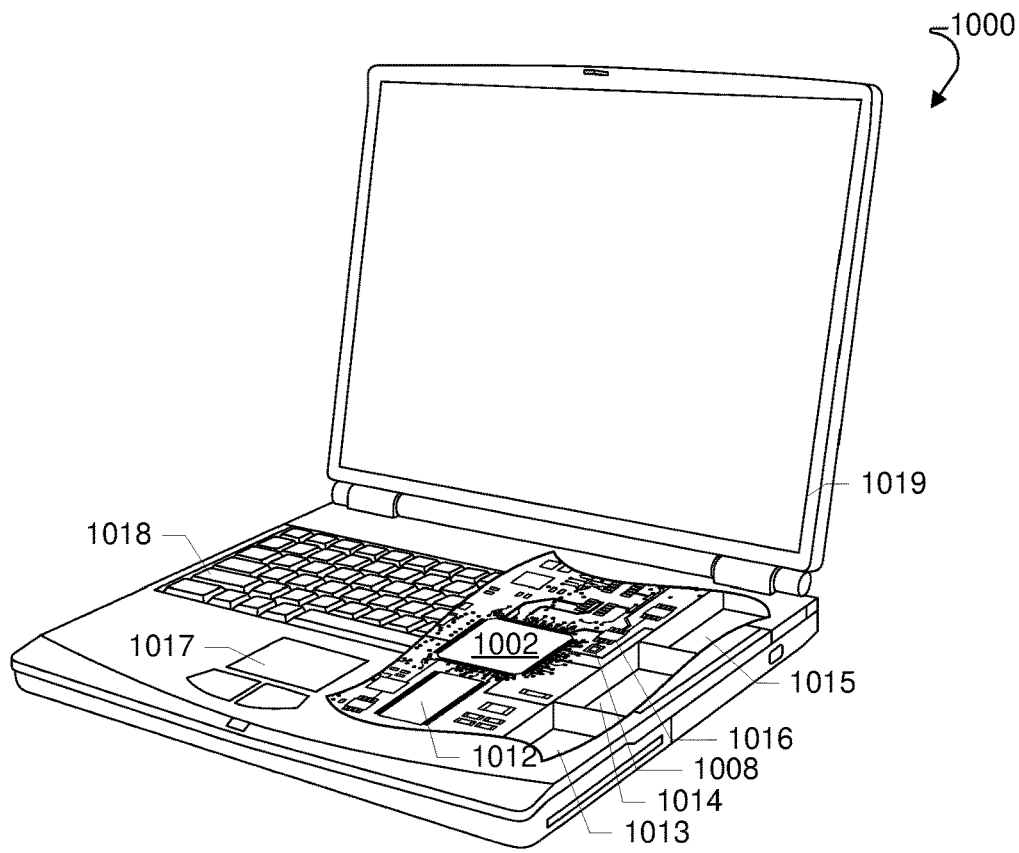
FIG. 10 is a component block diagram illustrating an example mobile computing device suitable for implementing various embodiments.

The various embodiments (including, but not limited to, embodiments described above with reference to FIGS. 1-8) may be implemented in a wide variety of computing systems include a laptop computer 1000 an example of which is illustrated in FIG. 10. Many laptop computers include a touchpad touch surface 1017 that serves as the computer's pointing device, and thus may receive drag, scroll, and flick gestures similar to those implemented on computing devices equipped with a touch screen display and described above. A laptop computer 1000 will typically include a processor 1002 coupled to volatile memory 1012 and a large capacity nonvolatile memory, such as a disk drive 1013 of Flash memory. Additionally, the computer 1000 may have one or more antenna 1008 for sending and receiving electromagnetic radiation that may be connected to a wireless data link and/or cellular telephone transceiver 1016 coupled to the processor 1002. The computer 1000 may also include a floppy disc drive 1014 and a compact disc (CD) drive 1015 coupled to the processor 1002. In a notebook configuration, the computer housing includes the touchpad 1017, the keyboard 1018, and the display 1019 all coupled to the processor 1002. Other configurations of the computing device may include a computer mouse or trackball coupled to the processor (e.g., via a USB input) as are well known, which may also be used in conjunction with the various embodiments.

Figure 11:
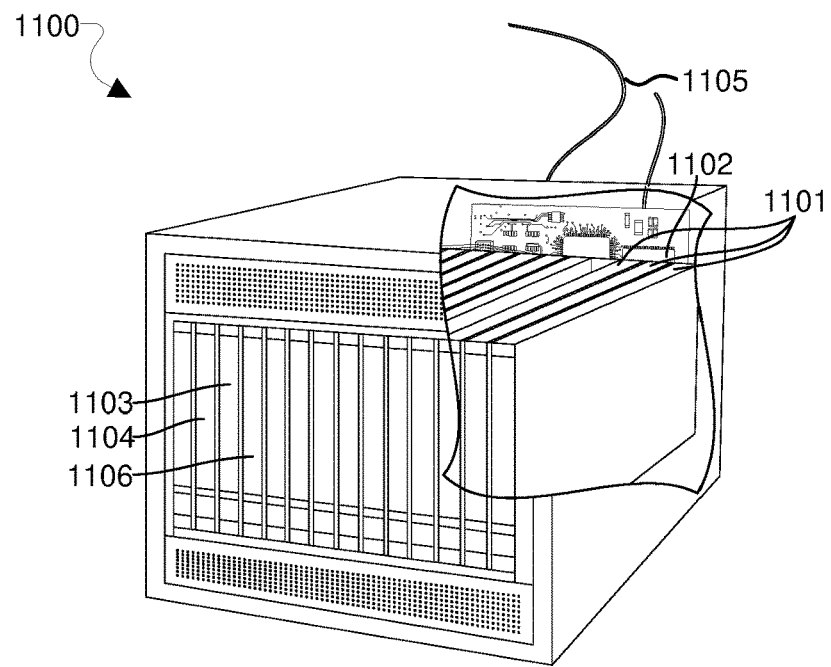
FIG. 11 is a component block diagram illustrating an example server suitable for implementing various embodiments.

The various embodiments (including, but not limited to, embodiments described above with reference to FIGS. 1-9) may also be implemented in fixed computing systems, such as any of a variety of commercially available servers. An example server 1100 is illustrated in FIG. 11. Such a server 1100 typically includes one or more multicore processor assemblies 1101 coupled to volatile memory 1102 and a large capacity nonvolatile memory, such as a disk drive 1104. As illustrated in FIG. 11, multicore processor assemblies 1101 may be added to the server 1100 by inserting them into the racks of the assembly. The server 1100 may also include a floppy disc drive, compact disc (CD) or digital versatile disc (DVD) disc drive 1106 coupled to the processor 1101. The server 1100 may also include network access ports 1103 coupled to the multicore processor assemblies 1101 for establishing network interface connections with a network 1105, such as a local area network coupled to other broadcast system computers and servers, the Internet, the public switched telephone network, and/or a cellular data network (e.g., CDMA, TDMA, GSM, PCS, 3G, 4G, 5G, LTE, or any other type of cellular data network).

Computer program code or "program code" for execution on a programmable processor for carrying out operations of the various embodiments may be written in a high level programming language such as C, C++, C #, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

Implementation examples are described in the following paragraphs. While some of the following implementation examples are described in terms of an example computing device memory system, further example implementations may include: the example functions of the computing device memory system discussed in the following paragraphs implemented as methods of the following implementation examples; and the example computing device memory system discussed in the following paragraphs implemented by a computing device memory system including means for performing functions of the computing device memory system of the following implementation examples.

Example 1. A computing device memory system, having a memory device, a memory physical layer communicatively connected to the memory device, a first input/output (TO) voltage supply electrically connected to the memory device and to the memory physical layer, and a second TO voltage supply electrically connected to the memory device and to the memory physical layer, in which the memory device and the physical layer communicate data of a memory transaction using a 3 level pulse amplitude modulation (PAM) TO scheme.

Example 2. The computing device memory system of example 1, in which the first TO voltage supply is a first dedicated TO voltage supply, and the second TO voltage supply is a second dedicated TO voltage supply.

Example 3. The computing device memory system of example 1, in which the first TO voltage supply is a dedicated TO voltage supply, and the second TO voltage supply is a shared TO voltage supply.

Example 4. The computing device memory system of any of examples 1-3, further including a first core voltage supply and a second core voltage supply, in which each of the first core voltage supply and the second core voltage supply are electrically connected to the memory device, and in which the shared IO voltage supply is electrically connected to the second core voltage supply.

Example 5. The computing device memory system of any of examples 1-4, further including a third core voltage supply, in which the third core voltage supply is electrically connected to the memory device, and in which a voltage of the second core voltage supply is greater than a voltage of the third core voltage supply.

Example 6. The computing device memory system of any of examples 1-3, further including a first core voltage supply, a second core voltage supply, and a third core voltage supply, in which each of the first core voltage supply, the second core voltage supply, and the third core voltage supply are electrically connected to the memory device, in which the shared TO voltage supply is electrically connected to the third core voltage supply, and in which a voltage of the second core voltage supply is greater than a voltage of the third core voltage supply.

Example 7. The computing device memory system of any of examples 1-5, in which a voltage of the second TO voltage supply is greater than a voltage of the first TO voltage supply.

Example 8. The computing device memory system of any of examples 1-7, in which the data of the memory transaction is binary data, and the memory device and the memory physical layer further convert between the binary data and 3 level PAM IO scheme signals using the first TO voltage supply and the second TO voltage supply.

Example 9. The computing device memory system of any of examples 1-8, in which the memory device encodes the data of the memory transaction for generating a 3 level PAM signal, and generates the 3 level PAM signal by controlling selective electrical connection of the first TO voltage supply, the second TO voltage supply, or a ground to a component of the memory device according to the encoded data.

Example 10. The computing device memory system of any of examples 1-9, in which the memory physical layer encodes the data of the memory transaction for generating a 3 level PAM signal, and generates the 3 level PAM signal by controlling selective electrical connection of the first TO voltage supply, the second TO voltage supply, or a ground to a component of the memory physical layer according to the encoded data.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A system, comprising:
a memory physical layer;
a first input/output (TO) voltage supply electrically connected to the memory physical layer; and
a second IO voltage supply electrically connected to the memory physical layer,
wherein the memory physical layer is configured to communicate a data of a memory transaction using a 3 level pulse amplitude modulation (PAM) IO scheme by:
generating a first 3 level PAM signal by selectively electrically connecting the first IO voltage supply to an output;
generating a second 3 level PAM signal by selectively electrically connecting the second IO voltage supply to the output; and
generating a third 3 level PAM signal by selectively electrically connecting a ground to the output.

2. The system of claim 1, wherein:
the first IO voltage supply is a first dedicated IO voltage supply; and
the second IO voltage supply is a second dedicated IO voltage supply.

3. The system of claim 1, wherein:
the first IO voltage supply is a dedicated IO voltage supply; and
the second IO voltage supply is a shared IO voltage supply.

4. The system of claim 3, further comprising a first core voltage supply and a second core voltage supply, wherein each of the first core voltage supply and the second core voltage supply are electrically connected to a memory device, and wherein the shared IO voltage supply is electrically connected to the second core voltage supply.

5. The system of claim 4, further comprising a third core voltage supply, wherein the third core voltage supply is electrically connected to the memory device, and wherein a voltage of the second core voltage supply is greater than a voltage of the third core voltage supply.

6. The system of claim 3, further comprising a first core voltage supply, a second core voltage supply, and a third core voltage supply, wherein each of the first core voltage supply, the second core voltage supply, and the third core voltage supply are electrically connected to the memory device, wherein the shared IO voltage supply is electrically connected to the third core voltage supply, and wherein a voltage of the second core voltage supply is greater than a voltage of the third core voltage supply.

7. The system of claim 1, wherein a voltage of the second IO voltage supply is greater than a voltage of the first IO voltage supply.

8. The system of claim 1, wherein the data of the memory transaction is binary data, and wherein the memory physical layer is further configured to convert between the binary data and 3 level PAM signals using the first IO voltage supply and the second IO voltage supply.

9. The system of claim 1, wherein:
the output is a component of the memory physical layer; and
the memory physical layer is further configured to:

encode the data of the memory transaction for generating 3 level PAM signals, wherein:
    generating the first 3 level PAM signal by selectively electrically connecting the first IO voltage supply to the output comprises generating the first 3 level PAM signal according to the encoded data;
    generating the second 3 level PAM signal by selectively electrically connecting the second IO voltage supply to the output comprises generating the second 3 level PAM signal according to the encoded data; and
    generating the third 3 level PAM signal by selectively electrically connecting the ground to the output comprises generating the third 3 level PAM signal according to the encoded data.

10. The system of claim 1, wherein the memory physical layer is further configured to:
    receive a fourth 3 level PAM signal;
    compare the fourth 3 level PAM signal to a first voltage reference of one of the first IO voltage supply, the second IO voltage supply, and the ground generating a first receiver output signal;
    compare the fourth 3 level PAM signal to a second voltage reference of a different one of the first IO voltage supply, the second IO voltage supply, and the ground generating a second receiver output signal; and
    decode the first receiver output signal and the second receiver output signal generating a data signal.

11. A method for a 3 level pulse amplitude modulation (PAM) IO scheme in a system, comprising:
    providing a first input/output (TO) voltage to a memory physical layer;
    providing a second IO voltage to the memory physical layer, and communicating data of a memory transaction using the 3 level PAM IO scheme by the memory physical layer by:
        generating a first 3 level PAM signal by selectively electrically connecting the first IO voltage to an output;
        generating a second 3 level PAM signal by selectively electrically connecting the second IO voltage to the output; and
        generating a third 3 level PAM signal by selectively electrically connecting a ground to the output.

12. The method of claim 11, wherein:
the first IO voltage is a first dedicated IO voltage; and
the second IO voltage is a second dedicated IO voltage.

13. The method of claim 11, wherein:
the first IO voltage is a dedicated IO voltage; and
the second IO voltage is a shared IO voltage.

14. The method of claim 13, further comprising:
providing a first core voltage to the memory device;
providing a second core voltage to the memory device, wherein the second core voltage is the shared IO voltage.

15. The method of claim 14, further comprising providing a third core voltage to the memory device, wherein the second core voltage is greater than the third core voltage.

16. The method of claim 13, further comprising:
providing a first core voltage to the memory device;
providing a second core voltage to the memory device; and
providing a third core voltage to the memory device, wherein the third core voltage is the shared IO voltage, and
wherein the second core voltage is greater than the third core voltage.

17. The method of claim 11, wherein the second IO voltage is greater than the first IO voltage.

18. The method of claim 11, wherein:
the data of the memory transaction is binary data; and
the method further comprises converting between the binary data and 3 level PAM signals using the first IO voltage and the second IO voltage.

19. The method of claim 11, wherein the output is a component of the memory physical layer, the method further comprising:
    encoding the data of the memory transaction for generating 3 level PAM signals, wherein:
        generating the first 3 level PAM signal by selectively electrically connecting the first IO voltage to the output comprises generating the first 3 level PAM signal according to the encoded data;
        generating the second 3 level PAM signal by selectively electrically connecting the second IO voltage to the output comprises generating the second 3 level PAM signal according to the encoded; and
        generating the third 3 level PAM signal by selectively electrically connecting the ground to the output comprises generating the third 3 level PAM signal according to the encoded data.

20. The method of claim 11, further comprising:
receiving a fourth 3 level PAM signal;
comparing the fourth 3 level PAM signal to a first voltage reference of one of the first IO voltage supply, the second IO voltage supply, and the ground generating a first receiver output signal;
comparing the fourth 3 level PAM signal to a second voltage reference of a different one of the first IO voltage supply, the second IO voltage supply, and the ground generating a second receiver output signal; and
decoding the first receiver output signal and the second receiver output signal generating a data signal.

21. A system, comprising:
a memory device;
a first input/output (TO) voltage supply electrically connected to the memory device; and
a second IO voltage supply electrically connected to the memory device,
wherein the memory device is configured to communicate a data of a memory transaction using a 3 level pulse amplitude modulation (PAM) IO scheme by:
    generating a first 3 level PAM signal by selectively electrically connecting the first IO voltage supply to an output;
    generating a second 3 level PAM signal by selectively electrically connecting the second IO voltage supply to the output; and
    generating a third 3 level PAM signal by selectively electrically connecting a ground to the output.

22. The system of claim 21, wherein:
the first IO voltage supply is a first dedicated IO voltage supply; and
the second IO voltage supply is a second dedicated IO voltage supply.

23. The system of claim 21, further comprising:
a first core voltage supply electrically connected to the memory device; and
a second core voltage supply electrically connected to the memory device.

24. The system of claim 23, wherein the first IO voltage supply is eclectically connected to a memory physical layer, the system further comprising a shared IO voltage supply electrically connected to the second core voltage supply and to the memory physical layer.

25. The system of claim 24, further comprising a third core voltage supply electrically connected to the memory device, wherein a voltage of the second core voltage supply is greater than a voltage of the third core voltage supply.

26. The system of claim 23, further comprising:
a third core voltage supply electrically connected to the memory device; and
a shared IO voltage supply electrically connected to the third core voltage supply and to a memory physical layer, wherein a voltage of the second core voltage supply is greater than a voltage of the third core voltage supply.

27. The system of claim 21, wherein a voltage of the second IO voltage supply is greater than a voltage of the first IO voltage supply.

28. The system of claim 21, wherein the data of the memory transaction is binary data, and wherein the memory device is further configured to convert between the binary data and 3 level PAM signals using the first IO voltage supply and the second IO voltage supply.

29. The system of claim 21, wherein:
the output is a component of the memory device; and
the memory device is further configured to:
encode the data of the memory transaction for generating 3 level PAM signals, wherein:
generating the first 3 level PAM signal by selectively electrically connecting the first IO voltage supply to the output comprises generating the first 3 level PAM signal according to the encoded data;
generating the second 3 level PAM signal by selectively electrically connecting the second IO voltage supply to the output comprises generating the second 3 level PAM signal according to the encoded data; and
generating the third 3 level PAM signal by selectively electrically connecting the ground to the output comprises generating the third 3 level PAM signal according to the encoded data.

30. The system of claim 21, wherein the memory device is further configured to:
receive a fourth 3 level PAM signal;
compare the fourth 3 level PAM signal to a first voltage reference of one of the first IO voltage supply, the second IO voltage supply, and the ground generating a first receiver output signal;
compare the fourth 3 level PAM signal to a second voltage reference of a different one of the first IO voltage supply, the second IO voltage supply, and the ground generating a second receiver output signal; and
decode the first receiver output signal and the second receiver output signal generating a data signal.

* * * * *